US009388900B2

(12) United States Patent
Hoppe et al.

(10) Patent No.: US 9,388,900 B2
(45) Date of Patent: Jul. 12, 2016

(54) METHOD FOR PRODUCING A PISTON RING HAVING EMBEDDED PARTICLES

(75) Inventors: Steffan Hoppe, Overath (DE); Marcus Kennedy, Düsseldorf (DE); Manfred Fischer, Leichlingen (DE); Michael Zinnabold, Burscheid (DE); Robert R. Aharonov, W. Bloomfield, MI (US)

(73) Assignee: Federal-Mogul Burscheid GmbH, Burscheid (DE)

( * ) Notice: Subject to any disclaimer, the term of this patent is extended or adjusted under 35 U.S.C. 154(b) by 857 days.

(21) Appl. No.: 13/699,898

(22) PCT Filed: May 24, 2011

(86) PCT No.: PCT/EP2011/058427
§ 371 (c)(1),
(2), (4) Date: Apr. 8, 2013

(87) PCT Pub. No.: WO2011/147808
PCT Pub. Date: Dec. 1, 2011

(65) Prior Publication Data
US 2013/0192458 A1 Aug. 1, 2013

(30) Foreign Application Priority Data

May 25, 2010 (DE) .......... 10 2010 029 256

(51) Int. Cl.
F16J 9/26 (2006.01)
C23C 16/26 (2006.01)
F02F 1/00 (2006.01)

(52) U.S. Cl.
CPC . *F16J 9/26* (2013.01); *C23C 16/26* (2013.01); *F02F 1/004* (2013.01); *Y10T 428/24975* (2015.01); *Y10T 428/26* (2015.01)

(58) Field of Classification Search
CPC ............ F16J 9/26; F02F 7/0085; C23C 16/26
See application file for complete search history.

(56) References Cited

U.S. PATENT DOCUMENTS 5,275,850 A 1/1994 Kitoh et al.
5,518,347 A 5/1996 Cobb, Jr.
(Continued)

FOREIGN PATENT DOCUMENTS

AT 504482 A4 6/2008
DE 102005063123 B3 5/2007
JP H01269222 A 10/1989
(Continued)

OTHER PUBLICATIONS

Fraunhofer IST, Produktnamenverzeichnis—Kohlenstoffschichten, Eitec GmbH & Co KG, Bochum, Deutschland, http://www.ist.fraunhofer.de/c-produkte/e-f/eitec-achme.html, 2009.

*Primary Examiner* — Nathaniel Wiehe
*Assistant Examiner* — Daniel Collins
(74) *Attorney, Agent, or Firm* — Robert L. Stearns; Dickinson Wright, PLLC

(57) ABSTRACT

A sliding element, in particular a piston ring or a cylinder liner, comprising at least one a-C:H:Me layer, where Me is germanium and silicon, having a layer thickness of 10-40 μm, is provided.

17 Claims, 2 Drawing Sheets

(56) References Cited

U.S. PATENT DOCUMENTS

| | | |
|---|---|---|
| 6,046,758 A | 4/2000 | Brown et al. |
| 6,086,769 A | 7/2000 | Kilambi et al. |
| 6,279,913 B1 | 8/2001 | Iwashita et al. |
| 6,325,385 B1 | 12/2001 | Iwashita et al. |
| 8,846,590 B2 * | 9/2014 | Castle .................. C10M 135/18 123/1 A |

FOREIGN PATENT DOCUMENTS

| | | |
|---|---|---|
| JP | H01286113 A | 11/1989 |
| JP | 2000120869 A | 4/2000 |
| RU | 2127180 C1 | 3/1999 |
| WO | 2009006179 A1 | 1/2009 |
| WO | 2009011801 A1 | 1/2009 |
| WO | 2009121719 A2 | 10/2009 |

* cited by examiner

METHOD FOR PRODUCING A PISTON RING HAVING EMBEDDED PARTICLES

TECHNICAL FIELD

The application relates to a sliding element, in particular a piston ring or a cylinder liner, comprising at least one a-C:H:Me layer, wherein Me represents germanium and silicon.

RELATED ART

The objective of decreasing $CO_2$ emissions from combustion engines can essentially only be achieved by reducing fuel consumption. Friction losses in the engine, as well as wear and tear, play an essential role in this regard. The piston assembly, and thus the piston rings, are responsible to a large extent for the friction losses.

With highly stressed engines, there is, in addition, the requirement to provide the running surfaces of the piston rings with coatings that are highly wear-resistant. Coatings based on hard materials which are applied by means of PVD (physical vapor deposition) or CVD (chemical vapor deposition) are increasingly being employed for this. They are supposed to ensure functionality throughout service life.

It is known that DLC (diamond-like carbon) layers mostly have very small coefficients of friction with regard to sliding contact surfaces since their adhesive tendency is very low. This allows friction losses in the engine to be effectively reduced.

DE 10 2005 063 123, for example, describes a sliding element comprising at least one surface for sliding contact with a running surface having applied thereto a wear layer and a running-in layer made of carbon, wherein the running-in layer contains hydrogen and nanocrystalline carbide phases. This coating leads to an excellent running-in behavior.

U.S. Pat. No. 6,279,913 describes a sliding element having a DLC layer on the sliding surface. The DLC layer thereby has a spherical surface structure with a layer thickness of from 0.5 to 30 μm. The DLC layer has either an amorphous, an amorphous/diamond-like or an amorphous/graphite-like carbon structure.

U.S. Pat. No. 6,325,385 also describes a piston ring comprising a DLC layer. This is applied to an underlayer. The underlayer consists of one or more elements selected from the group consisting of silicon, titanium, tungsten, chromium, molybdenum, niobium and vanadium in an amount of 70 atomic percent or more and below 100 atomic percent, the remainder consisting of carbon, or of one or more of said elements in an amount of 100 atomic percent. The underlayer makes up 1 to 35 percent of the overall thickness of the DLC layer and the underlayer, its thickness thus lying in the range of from 0.05 to 1.75 μm.

According to U.S. Pat. No. 6,325,385, the thin underlayer is for reducing stresses occurring in the interior of the DLC layer. This increases the adhesion of the DLC layer and avoids the occurrence of defects in the layer such as cracks or indentations. According to U.S. Pat. No. 6,325,385, the underlayer has, however, poor wear resistance and is therefore supposed to be quickly removed once exposed as a result of wear of the DLC layer.

The life of such DLC layers is, however, limited as a result of, inter alia, the small layer thicknesses, and therefore friction can be reduced only for a certain period of time. Thus, the DLC layer of the piston ring in U.S. Pat. No. 6,325,385, owing to its minor thickness, also displays its action mainly during the running-in phase. Thereafter, the friction losses increase again due to the changed tribological system.

Therefore, there is a need for a sliding element, particularly a piston ring or a cylinder liner, with which a lower coefficient of friction can be ensured over an extended period of time, preferably throughout the entire life of the combustion engine in which the sliding element is being used.

SUMMARY OF THE INVENTION

This object has surprisingly been achieved by the use of an a-C:H:Me layer, wherein Me represents germanium and silicon and the thickness of the a-C:H:Me layer(s) is from 10 to 40 μm.

THE DRAWINGS

DETAILED DESCRIPTION

Figure 1:
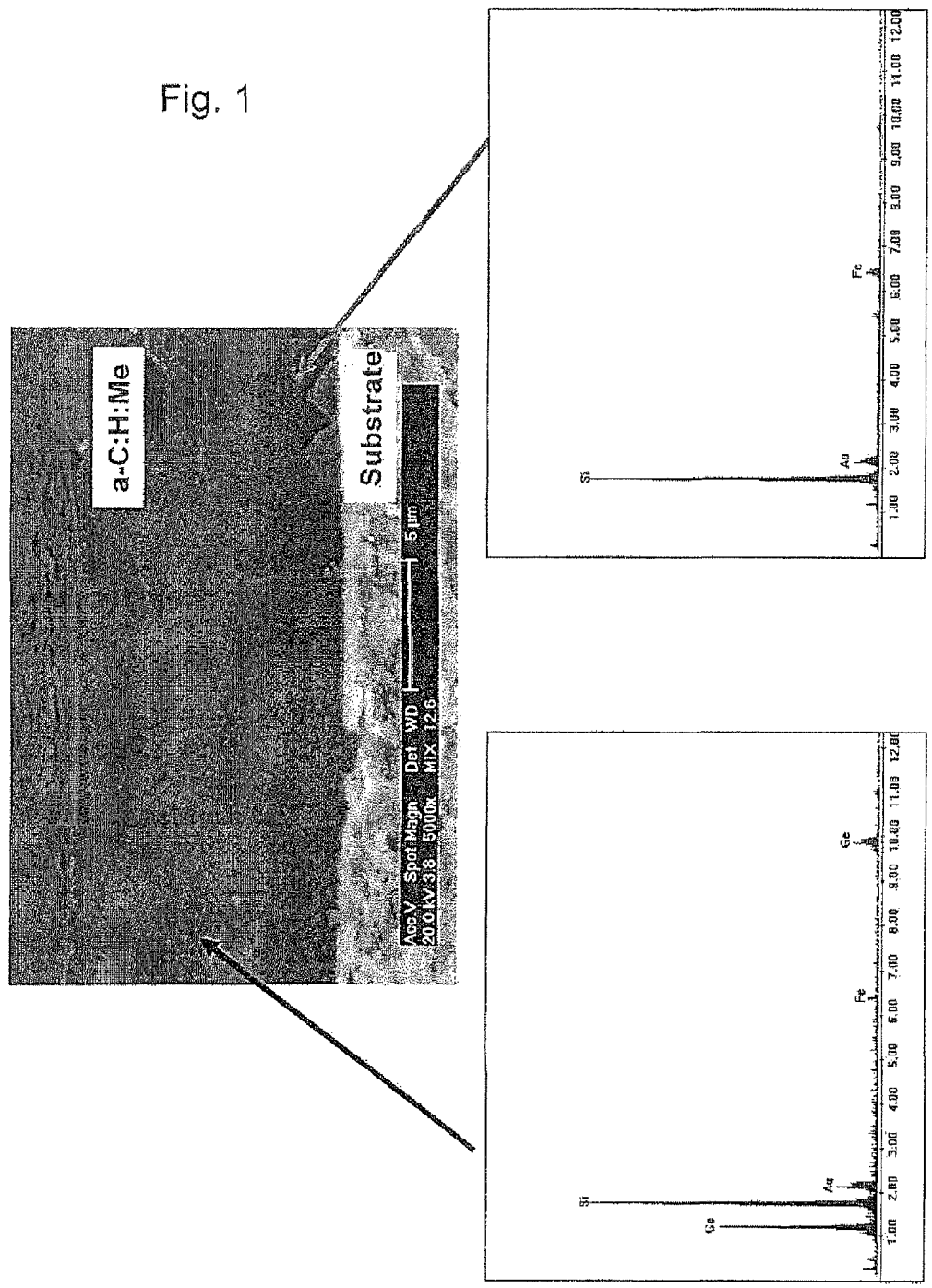
FIG. 1 shows REM and EDX diagrams of the piston ring of example 1.

The a-C:H:Me layer as used within the scope of the present invention is an amorphous DLC layer made of carbon and hydrogen which further contains both germanium and silicon.

It is assumed that germanium and silicon reduce the internal stress in the layer (see also U.S. Pat. No. 6,086,769) and thus allow the deposition of layers having a thickness greater than in the prior art.

It is possible within the scope of the present invention for one or more a-C:H:Me layers to be applied to the sliding element. If several layers are used, these differ, for example, in terms of composition. The overall thickness of the a-C:H:Me layer(s) is from 15 to 40 μm, preferably from 15 to 30 μm.

The germanium and silicon content in the layer preferably is from 5 to 70 wt. %, particularly preferred being 40 to 60 wt. %. When the germanium and silicon content lies in this range, internal stresses are reduced such that very great layer thicknesses may be obtained.

In a particularly preferred embodiment, it is preferred in each case for the germanium and silicon content in the layer to be from 5 to 35 wt. %, particularly from 20 to 30 wt. %.

The ratio of germanium to silicon in the layer according to the invention preferably is from 1:7 to 7:1, more preferably from 1:2 to 2:1.

The sliding element according to the invention preferably further contains an a-C:H layer, i.e., an amorphous DLC layer comprising carbon and hydrogen and free of germanium and silicon. This a-C:H layer is preferably applied to the a-C:H:Me layer as a cover layer. As a result of its higher wear resistance due to its being free of metal, this a-C:H layer results in an optimal running-in behavior. The a-C:H layer expediently has a thickness of up to 3 μm since layer thicknesses exceeding 3 μm may give rise to adhesion problems owing to excessively high internal stresses within the metal-free layer.

In the sliding element according to the invention, the aforementioned layers are preferably applied to a base body made of cast iron or steel material.

The individual layers may be applied to the base body by means of, e.g., plasma-enhanced chemical vapor deposition or glow discharge. Suitable methods are described, for example, in WO 2009/006179 and WO 2009/011801, the disclosures of which are herein incorporated by reference.

The sliding element according to the invention is suitable for a multiplicity of applications and is preferably used for piston rings or cylinder liners.

The invention will be explained in more detail below with reference to examples. These examples are, however, in no way intended to limit the scope of the invention.

Examples 1 and 2

|  | Layer thickness [μm] | Wt. % | | |
|---|---|---|---|---|
|  |  | C + H | Si | Ge |
| Example 1 (comparison) | 4-5 | 62.4 | 37.6 | 0 |
|  | 6-7 | 49.4 | 26 | 24.6 |
|  | 1 | 100 |  |  |
| Example 2 | 21 | 49.6 | 25.9 | 24.5 |
|  | 1 | 100 |  |  |

The hardness and the modulus of indentation on the running surface of the piston ring were measured on the above samples using a Picodentor HM500 in accordance with DIN EN ISO 14577-1.

The following results were obtained:

|  | Hardness HV 0.02 | Indentation modulus [GPa] |
|---|---|---|
| Example 1 (comparison) | 1672 ± 41 | 116 ± 2 |
| Example 2 | 1602 ± 44 | 112 ± 2 |

FIG. 1 shows the layer structure based on REM and EDX diagrams of the piston ring obtained in example 1.

Figure 2:
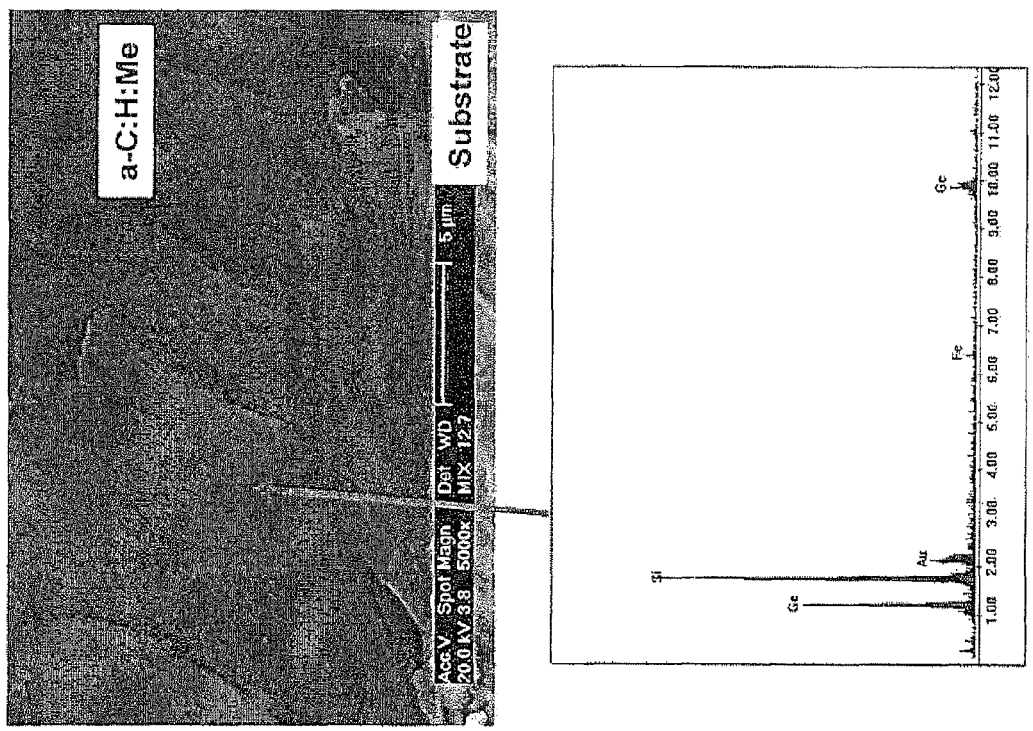
FIG. 2 shows REM and EDX diagrams of the piston ring of example 2.

FIG. 2 shows the layer structure based on REM and EDX diagrams of the piston ring obtained in example 2.

The invention claimed is:

1. A sliding element comprising: at least one a C:H:Me layer applied to at least a section of the sliding element, wherein the C:H:Me layer includes germanium and silicon, the overall thickness of the at least one a C:H:Me layer is from 15 to 40 μm, and an a C:H layer is applied to the a C:H:Me layer as a cover layer.

2. The sliding element according to claim 1, wherein the Me content in each of the a-C:H:Me layers is from 5 to 70 wt. %.

3. The sliding element according to claim 1, wherein the ratio of germanium to silicon in each of the a-C:H:Me layers is from 1:7 to 7:1.

4. The sliding element according to claim 1, wherein the content of germanium and silicon in each of the a-C:H:Me layers is in each case from 5 to 35 wt. %.

5. The sliding element according to claim 1, wherein the overall thickness of the a-C:H:Me layer(s) is from 15 to 30 μm.

6. The sliding element according to claim 1, wherein the thickness of the a-C:H layer is no more than 3 μm.

7. The sliding element according to claim 1, wherein the hardness of a running surface of the a-C:H layer, measured using a Picodentor HM500 in accordance with DIN EN ISO 14577-1, is from 1400 to 1900 HV 0.02.

8. The sliding element according to claim 7, wherein the indentation modulus of the running surface, measured using a Picodentor HM500 in accordance with DIN EN ISO 14577-1, is from 100 to 130 GPa.

9. The sliding element according to claim 1, comprising a base body made of cast iron or steel material.

10. The sliding element according to claim 1, wherein the layers are applied at least in the area provided for sliding contact with a sliding contact surface.

11. A piston ring comprising the sliding element according to claim 1.

12. A cylinder liner comprising the sliding element according to claim 1.

13. The sliding element according to claim 1, wherein the Me content in each of the a-C:H:Me layers is from 40 to 60 wt. %.

14. The sliding element according to claim 1, wherein the ratio of germanium to silicon in each of the a-C:H:Me layers is from 1:2 to 2:1.

15. The sliding element according to claim 1, wherein the content of germanium and silicon in each of the a-C:H:Me layers is in each case from 20 to 30 wt. %.

16. The sliding element according to claim 1, wherein the hardness of a running surface of the a-C:H layer, measured using a Picodentor HM500 in accordance with DIN EN ISO 14577-1, is from 1500 to 1800 HV 0.02.

17. The sliding element according to claim 16, wherein the indentation modulus of the running surface, measured using a Picodentor HM500 in accordance with DIN EN ISO 14577-1, is from 100 to 130 GPa.

* * * * *